(12) United States Patent
Suguro

(10) Patent No.: US 6,720,657 B2
(45) Date of Patent: Apr. 13, 2004

(54) SEMICONDUCTOR DEVICE AND METHOD OF MANUFACTURING THE SAME

(75) Inventor: Kyoichi Suguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/817,271

(22) Filed: Mar. 27, 2001

(65) Prior Publication Data

US 2001/0033023 A1 Oct. 25, 2001

(30) Foreign Application Priority Data

Mar. 28, 2000 (JP) ........................................ 2000-088700

(51) Int. Cl.[7] ..................... H01L 23/48; H01L 23/52; H01L 23/40
(52) U.S. Cl. ..................... 257/758; 257/751; 257/759; 257/760; 438/638
(58) Field of Search .................... 257/751, 763, 257/770, 759, 758, 760, 752, 753; 438/638

(56) References Cited

U.S. PATENT DOCUMENTS

| 5,470,792 | A | | 11/1995 | Yamada | ..................... | 438/625 |
|---|---|---|---|---|---|---|
| 5,786,272 | A | | 7/1998 | Marangon et al. | ........... | 438/628 |
| 5,981,374 | A | * | 11/1999 | Dalal et al. | ................. | 438/624 |
| 6,114,243 | A | * | 9/2000 | Gupta et al. | ................. | 438/687 |
| 6,144,099 | A | * | 11/2000 | Lopatin et al. | ............. | 257/758 |
| 6,146,986 | A | * | 11/2000 | Wagganer | .................... | 438/618 |
| 6,407,453 | B1 | * | 6/2002 | Watanabe et al. | ........... | 257/758 |

FOREIGN PATENT DOCUMENTS

| JP | 11224900 A | * | 8/1999 |
|---|---|---|---|
| JP | 5-283536 | | 10/2001 |

* cited by examiner

Primary Examiner—Bradley Baumeister
Assistant Examiner—Chris C. Chu
(74) Attorney, Agent, or Firm—Finnegan, Henderson, Farabow, Garrett & Dunner, L.L.P.

(57) ABSTRACT

The invention relates to a semiconductor device having improved wiring layers. The wiring is formed on the semiconductor substrate and has a first region and a second region. The first region comprises a conductive film and an insulating film formed by oxidizing a film connected to the conductive film and made of the same material thereof. The second region includes a wiring and is provided on the first region. The Gibbs free energy of the wiring decreases less than that of the conductive film when the wiring and the conductive film are oxidized.

31 Claims, 5 Drawing Sheets

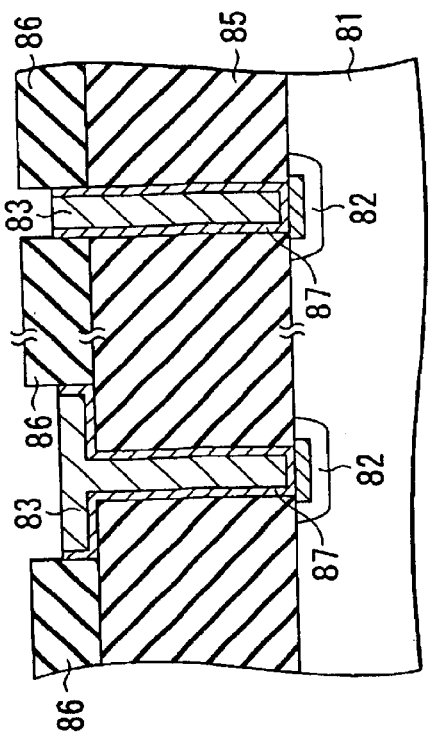
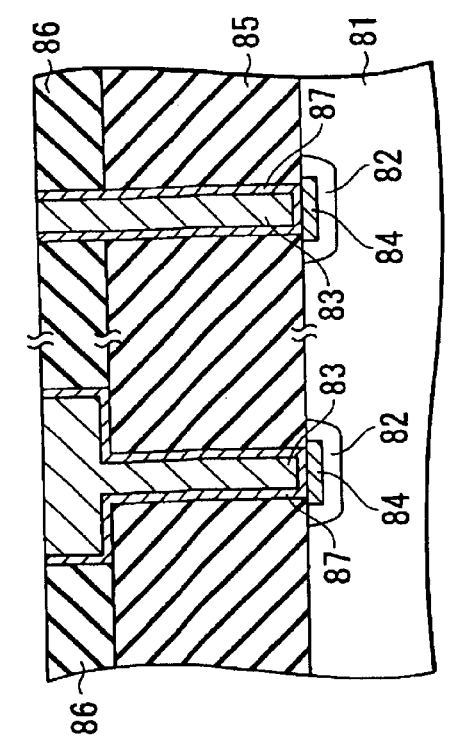
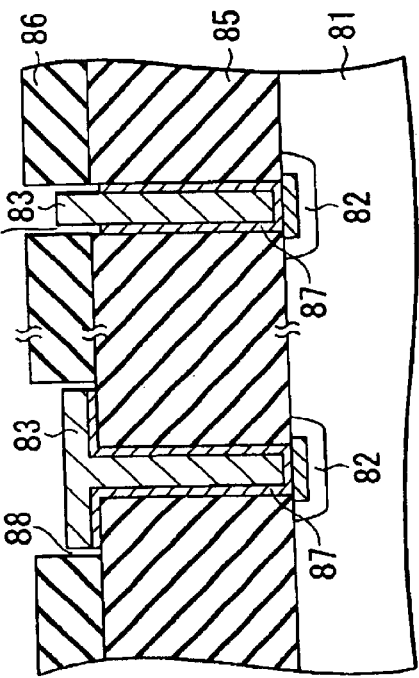
FIG. 4A PRIOR ART
FIG. 4B PRIOR ART
FIG. 4C PRIOR ART
FIG. 5 PRIOR ART

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2000-088700, filed Mar. 28, 2000, the entire contents of which are incorporated herein by reference.

BACKGROUND OF THE INVENTION

This invention relates to a semiconductor device and a method of manufacturing the same. More particularly, the invention relates to a semiconductor device having improved wiring layers and a method of manufacturing the semiconductor device.

In recent years, large-scale integrated circuits (LSIs) are used in great numbers in the important sections of computers and communication apparatuses. An LSI is provided in the form of a single chip, incorporating many transistors, resistors and the like that are connected, forming electric circuits. The performance of a computer or communication apparatus largely depends on the performance of every LSI used. The performance of each LSI may be enhanced by increasing the integration density, or making the constituent elements smaller.

MOS transistors, for example, can be made small by reducing the gate length and the thickness of the source/drain diffusion layers.

To form thin source/drain diffusing layers, low-acceleration ion implantation is usually employed. This process can form source/drain diffusion layers that are as thin as 0.1 µm or less.

Here arises a problem. Any source/drain diffusion layer made by the low-acceleration ion implantation has a high sheet resistance of 100 ohms/square or more, though it is thin, serving to form small MOS transistors. Unless the sheet resistance of the layer is reduced, the LSI comprising the MOS transistors cannot operate at high speeds.

To manufacture a high-speed LSI such as a logic LSI, so-called silicide technique is employed. This technique consists in forming a silicide film, in self-alignment, on a source/drain diffusion layer and gate electrodes. (The gate electrodes have been made by processing a polycrystalline silicon film doped with impurities.)

In the manufacture of a dual-gate MOS transistor, the silicide technique can not only lower the resistance of the gate electrodes, but also decrease the number of manufacturing steps. Note that a dual-gate MOS transistor is composed of an n-channel MOS transistor and a p-channel MOS transistor, the former having a gate electrode made of polycrystalline silicon doped with n-type impurity, and the latter having a gate electrode made of polycrystalline silicon doped with p-type impurity.

The number of manufacturing steps can be decreased, because the gate electrodes (polycrystalline silicon strips) can be doped with impurities of a specific conductivity type in the step of forming the source/drain diffusion layer.

Dual-gate MOS transistors, each having polycide gate electrodes, are known. (A polycide gate electrode is composed of an impurity-doped polycrystalline silicon film and a metal silicide film, e.g., tungsten silicide film, formed on the impurity-doped polycrystalline silicon film.) In order to fabricate a dual-gate MOS transistor having polycide gate electrodes, a polycrystalline silicon film is masked with a metal silicide film during the ion implantation that is carried out to form a source/drain diffusion layer. Hence, the polycrystalline silicon film cannot be doped with impurities of a specific conductivity type.

It is therefore necessary to dope the polycrystalline silicon film with impurities of a specific conductivity type prior to the formation of the source/drain diffusion layer. Ions must be implanted to form the source/drain diffusion layer in one step, and ions must be implanted to dope the polycrystalline silicon film in another step. This increases the number of steps of manufacturing the dual-gate MOS transistor. More precisely, two more photolithography steps, two more ion implantation steps and two more resist-removing steps must be performed than in the case where the silicide technique is employed.

Any device that has a high integration density, such as a memory LSI (e.g., DRAM) must be of SAC (Self-Aligned Contact) structure. To provide a SAC structure, the inter-layer insulating film on a source/drain diffusion layer (usually, the one that is used as the source of a MOS transistor) is etched by RIE (Reactive Ion Etching), making a contact hole that extends to the source/drain diffusion layer. The contact hole may deviate from the desired position, but not so much as to expose the gate electrode (polycrystalline silicon film). To prevent the contact hole to deviate excessively from the desired position, a silicon nitride film, or an etching-stopping film, is formed on the gate electrode before the step of etching the inter-layer insulating film.

Due to the presence of the silicon nitride film, impurities cannot be injected into the gate electrode during the ion implantation for forming the source/drain diffusion layer. Hence, the silicide technique cannot be employed in the manufacture of memory LSIs, though it is applied in the manufacture of logic LSIs.

Most memory LSIs have gate electrodes made of polycrystalline silicon (i.e., polycrystalline silicon gate electrodes) that are doped with impurities. The polycrystalline silicon gate electrodes may be replaced by polysilycide gate electrodes, because the polysilicide gate electrodes have lower resistance. Alternatively, the polycrystalline silicon gate electrodes may be replaced by polymetal gate electrodes, each comprising a polycrystalline silicon film, a barrier metal film and a metal film (e.g., W film) laid one upon another in the order mentioned. Polymetal gate electrodes have lower resistance than the polysilicide gate electrodes and can therefore exhibit a sufficiently low resistance even if they are relatively thin. However, polymetal gate electrodes are disadvantageous in the following respect.

Logic LSIs have dual gates described above. Thus, if polymetal gate electrodes are used in a logic LSI, one step must be performed to implant impurity ions into the polycrystalline silicon film included in a polymetal gate electrode and another step must be carried out to implant impurity ions into the silicon substrate to form a source/drain diffusion layer, just as in the case where polysilicide gate electrodes are used in the logic LSI. This means an increase in the number of manufacturing steps, which inevitably raises the manufacturing cost.

In a hybrid LSI comprising logic ICs and a DRAM, a silicide film may be formed on the source/drain diffusion layers provided in the DRAM. If so, the leakage current at the pn-junctions of the memory cell increase, deteriorating the data-storing property of the DRAM. Additionally, the DRAM needs to have SAC structure as is described above. Hence, polycide electrodes made of tungsten (W) are used in the DRAM.

In a logic LSI, the MOS transistors need to have a low threshold voltage so that a current as large as possible may flow in the MOS transistors at low voltages. To this end, the gate electrode (i.e., polycrystalline silicon film) of each n-channel MOS transistor must be doped with n-type impurity such as P or As, thereby to have $n^-$ conductivity type, and the gate electrode of each p-channel MOS transistor must be doped with p-type impurity such as $BF_2$, thereby to have $p^+$ conductivity type.

The performance of an LSI cannot be enhanced only if the resistances of the drain and source of each MOS transistor are lowered. To enhance the performance, it is also important to reduce parasitic resistance resulting from the wiring and increase the density of the wiring.

In a device such as a DRAM, in which wirings must be arranged at high density, it is important to form contacts on the wirings in self-alignment. How contacts are formed in self-alignment by a conventional method will be described, with reference to FIGS. 4A to 4C, which are sectional views. The left half and right half of each figure show two regions of a device, respectively. The first region has a contact hole and a dual damascene (DD) wiring that has a width greater than the diameter of a contact hole. The second region has a contact hole and a DD wiring that has a width equal to the diameter of the contact hole.

As shown in FIG. 4A, DD wirings 83 made of W are formed. The DD wirings 83 electrically contact the diffusion layers 82 provided on a surface of a silicon substrate 81. The structure shown in FIG. 4A further comprises a $TiSi_2$ layer (metal silicide layer) 84, two inter-layer insulating films 85 and 86, and TiN films (barrier metal film) 87. The insulating films 85 and 86 are made mainly of $SiO_2$.

Next, the surface region of each DD wiring 83, each provided in a trench and having a thickness of about 50 to 100 nm, is removed by RIE as is shown in FIG. 4B. Each TiN layer 87 is thereby exposed at the rim of the trench.

As shown in FIG. 4C, a mixture of sulfuric acid and hydrogen peroxide is applied to the exposed part of each TiN layer 87, thus removing this part of the layer 87 by means of wet etching. Over-etching must be carried out in order to remove the exposed part of the layer 87 reliably and completely.

BRIEF SUMMARY OF THE INVENTION

According to the invention there is provided a semiconductor device that comprises a semiconductor substrate and a wiring layer. The wiring layer is formed on the semiconductor substrate and has a first region and a second region. The first region comprises a conductive film and an insulating film formed by oxidizing a film of the same material as the conductive film and connected to the conductive film. The second region is provided on the first region and includes a wiring. The Gibbs free energy of the wiring decreases less than that of the conductive film when the wiring and conductive film are oxidized.

According to the invention there is provided a method of manufacturing a semiconductor device, comprising the steps of: forming a first conductive film; forming a second conductive film on the first conductive film, the Gibbs free energy of the wiring decreases less than that of the conductive film when the wiring and conductive film are oxidized; etching a part of the second conductive film to expose a part of the first conductive film; and oxidizing the exposed part of the first conductive film to change the exposed part of the first conductive film to an insulating film.

As indicated above, the second conductive film has Gibbs free energy that decreases less than that of the first conductive film when the first and second conductive film are oxidized. The first conductive film can therefore be oxidized, without oxidizing the second conductive film, when both conductive films are exposed to an oxidizing atmosphere. Hence, any desired part of the first conductive film can be changed to an insulating film in the method according to the invention.

The first conductive film and second conductive film can be a barrier metal film and a metal wiring, respectively. If so, that part of the barrier metal film which is removed in the conventional method can be changed to an insulation film. This solves a problem which the inventor has found in the conventional technique and described in detailed description of the invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4C are sectional views explaining a conventional method of manufacturing a semiconductor device; and FIG. 5 is a sectional view for explaining a disadvantageous feature of the conventional method.

DETAILED DESCRIPTION OF THE INVENTION

Figure 1A:
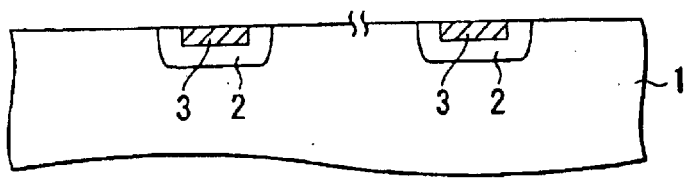
FIGS. 1A to 1H are sectional views explaining a method of manufacturing a semiconductor device according to the first embodiment of the present invention.

The inventor has found the problem in the conventional technique described in the background of the invention. Now the problem will be explained. As described above, over-etching must be performed to remove the exposed part of the TiN layer 87 reliably in the conventional method. When the over-etching is carried out, however, a gap 88 is made between the DD wiring 83 and the trench as is illustrated in FIG. 5. The gap 88 cannot always be filled up with silicon nitride during the CVD performed to deposit a silicon nitride film that may be etched at a different rate from silicon oxide film. The gap 88 may therefore remain between the DD wiring 83 and the trench.

Since the insulating films 85 and 86 are made mainly of $SiO_2$, they may allow passage of water. Water may pass through the films 85 and 86 and flow into the gap 88. Water, if accumulated in the gap 88, will evaporate during an ensuing heating step, affecting the operating reliability or efficiency of the device.

Even in the right-half region of the device shown in FIG. 5, where the wiring 83 and the plug 84 have the same width, the TiN layer 87 must be over-etched in the same way as in the left-half region. When the TiN layer 87 is over-etched, there arise the same problem as described above.

Embodiments of the present invention will be described, with reference to the accompanying drawings.

(First Embodiment)

FIGS. 1A to 1H are sectional views illustrating the steps of manufacturing a semiconductor device according to the first embodiment of the present invention. Shown in the left half of each figure is a region of the device, which has a contact hole and a wiring having a width greater than the diameter of the contact hole. Shown in the right half of each figure is another region of the device, which has a contact hole and a DD wiring a width equal to the diameter of the contact hole.

First, as shown in FIG. 1A, diffusion layers 2 are formed in one surface of a silicon substrate 1. TiSi$_2$ layers 3 (metal silicide layers) are then formed, each in the exposed surface of one diffusion layer 2. The diffusion layers 2 are source/drain diffusion layers of, for example, MOS transistors.

Figure 1B:
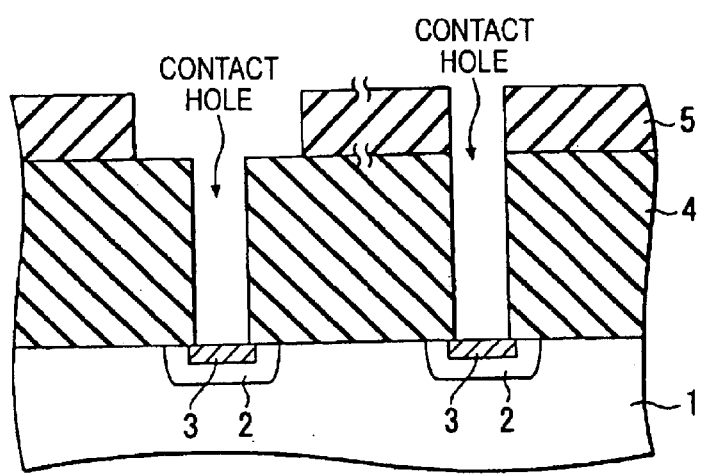

Then, as FIG. 1B shows, the first inter-layer insulating film 4 is formed on the silicon substrate 1, covering the diffusion layers 2 and TiSi$_2$ layers 3. Further, the second inter-layer insulating film 5 is formed on the first inter-layer insulating film 4. Etching is performed on both insulating films 4 and 5. A wiring groove is thereby made in the second inter-layer insulating film 5, and a contact hole is thereby made in the first inter-layer insulating film 4.

Figure 1C:
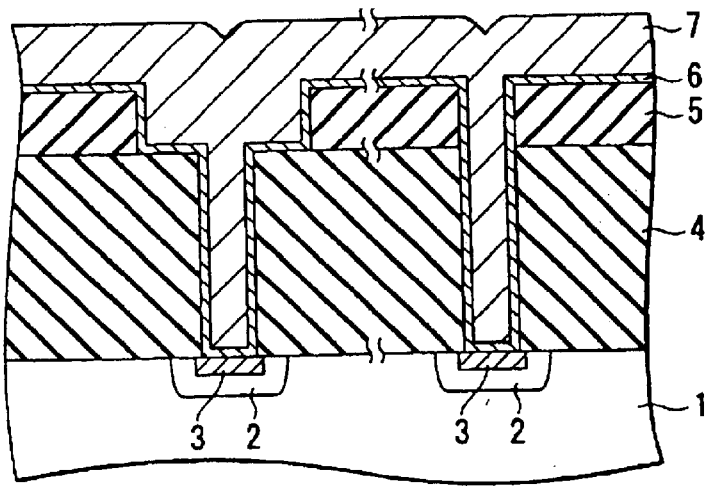

Next, as illustrated in FIG. 1C, a TiN film 6, i.e., a barrier metal film, is deposited on the upper surface of the structure and on the inner surfaces of the wiring groove and contact hole. Further, a W film 7, which will be processed to provide DD wirings, is deposited on the upper surface of the structure, filling the wiring groove and the contact hole.

Figure 1D:
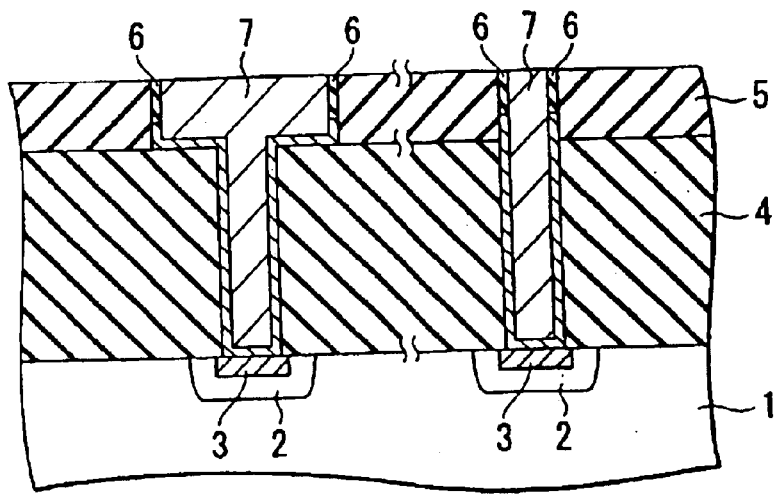

As shown in FIG. 1D, CMP (Chemical Mechanical Polishing) is performed, thereby removing those parts of the TiN film 6 and W film 7 which lie outside the wiring groove and contact hole. DD wirings 7 are thereby formed on the TiN films 6 that are provided in the wiring groove and contact hole.

Figure 1E:
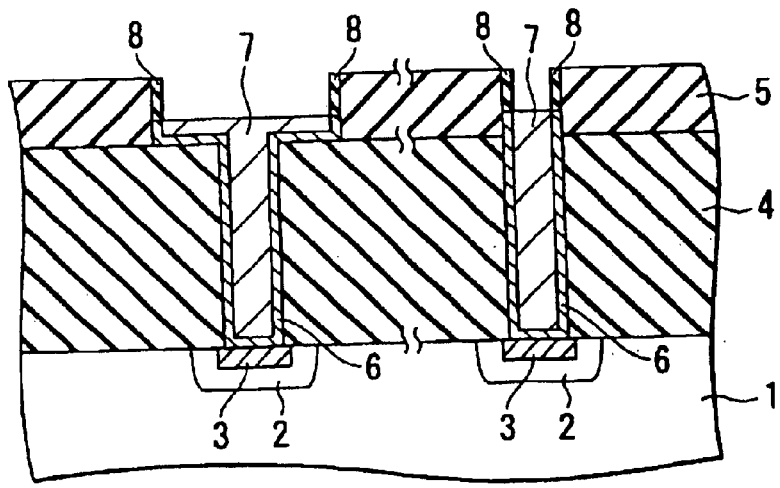

Then, as FIG. 1E shows, the surface region of each DD wiring 7, which is about 50 to 100 nm thick, is removed by means of RIE. The upper part of each TiN film is thereby exposed. The exposed part of each TiN film, which may cause short-circuiting, is oxidized by means of selective oxidation, thereby forming a TiO$_2$ film 8 (insulating film).

Figure 1F:
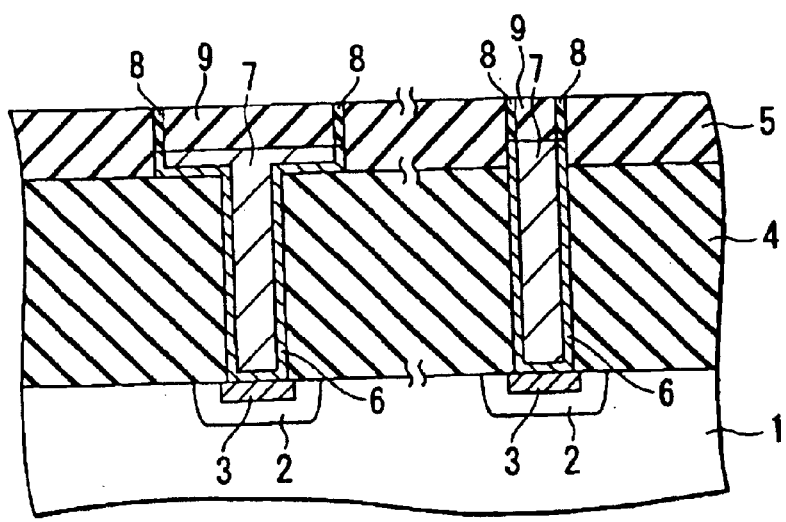

To provide a SAC structure, silicon nitride film 9 about 50 to 200 nm thick is formed by LP-CVD on the entire surface of silicon substrate 1, as is illustrated in FIG. 1F. Further, CMP is effected, removing silicon nitride film 9, except those parts provided on DD wirings 7. Thus, second inter-layer insulating film 5 is exposed and silicon nitride film 9 covers DD wirings 7 only.

In the first embodiment, those parts of the TiN films, which may cause short-circuiting, are not removed, but are oxidized. Hence, such a gap 88 as shown in FIG. 5 is not made at all. The problem described above, which may results from such a gap, will not arise in the present embodiment.

To demonstrate the advantage of the first embodiment, the inventor hereof made three types of structures that were generally identical to the structure of FIG. 1. The three types of structures had the same DD wiring length of 10 nm and different line-and-spaces for the DD wirings made of W. More precisely, the first type had a line-and-space of 100 nm, the second type a line-and-space of 130 nm, and the third type a line-and-space of 150 nm. A short-circuit test was carried out on 8-inch wafers, each having many structures of one type. That is, one hundred (100) parts of each 8-inch wafer were examined for short-circuiting. The test results were as is shown in the following

TABLE 1

| WIDTH OF WIRING | NON-SHORT-CIRCUITING YIELD | |
|---|---|---|
| | PRIOR ART | INVENTION |
| 150 nm | 60% | ≧90% |
| 130 nm | 55% | ≧90% |
| 100 nm | 50% | ≧85% |

As seen from Table 1, the ration of the non-short-circuiting parts to the short-circuiting parts (i.e., non-short-circuiting yield) much increased. More specifically, the first embodiment achieved a non-short-circuiting yield 30% higher than that attained in the conventional method. The invention is advantageous, particularly for semiconductor devices the design rule of which is 0.13 μm or less.

As seen from FIGS. 1E and 1F, the interface between the TiN film 6 and the TiO$_2$ film 8 is at the same height as the upper surface of the DD wiring 7. Nonetheless, the interface may be lower than the upper surface of the DD wiring 7. If this is the case, the DD wiring 7 is formed not only on the TiN film 6, but also on the TiO$_2$ film 8.

In the manufacturing step of FIG. 1E, the TiO$_2$ film 8 can be oxidized, while not oxidizing the DD wiring (W wiring) 7, in an atmosphere of low oxygen content and a low temperature of 300° C. or less or by oxidation using water vapor diluted with hydrogen. To accomplish selective oxidation of the TiN film 6 at high efficiency, it is desired that the TiN film 6 be placed in an atmosphere consisting of hydrogen and water vapor, an atmosphere consisting of carbon monoxide and carbon dioxide, or a similar oxidizing atmosphere.

Figure 2:
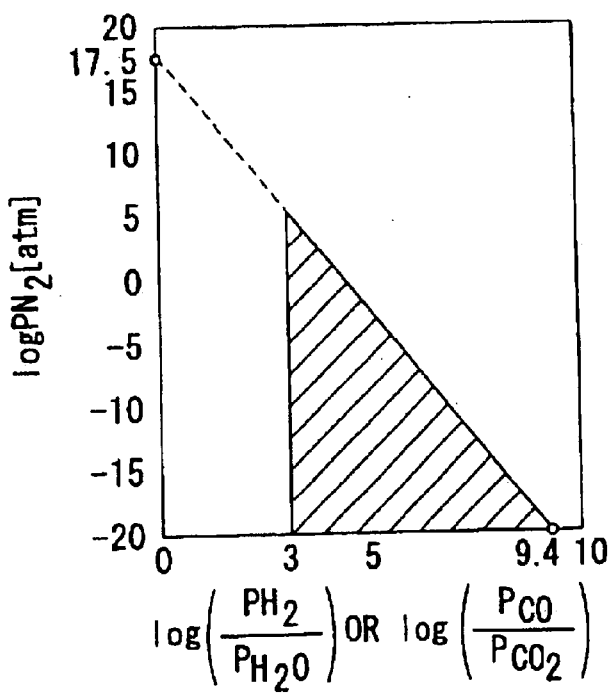
FIG. 2 is a diagram a range of $N_2$ partial pressure, which can be applied to perform selective oxidation on a TiN film.

To operate a selective oxidation apparatus in safety, it is recommendable to dilute the oxidizing atmosphere with nitrogen or argon. If the atmosphere is diluted with nitrogen, it is necessary to set the partial pressure of nitrogen within the range illustrated in FIG. 2. The shaded region shown in FIG. 2 indicates the range of N$_2$ partial pressure that can be applied to accomplish selective oxidation of the TiN film 6. Any N$_2$ partial pressure outside this range cannot be applied in the selective oxidation. In other words, the N$_2$ partial pressure must be set within a certain range in order to perform selective etching on the TiN film 6.

Figure 1G:
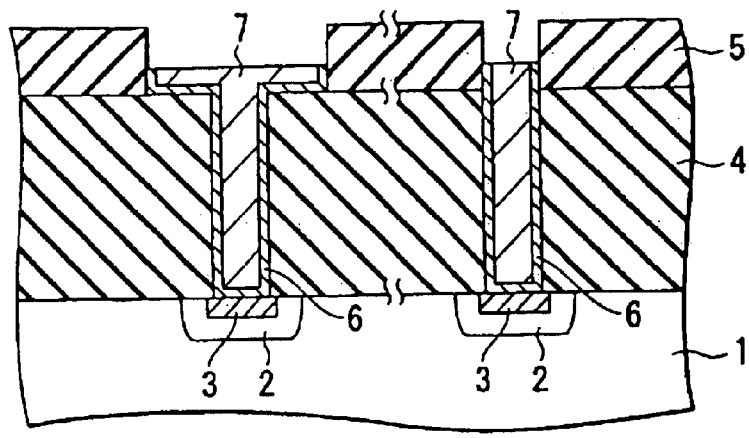

It may be necessary to remove the TiO$_2$ film 8. If so, hot concentrated sulfuric acid should better be used as etching solution. When hot concentrated sulfuric acid is applied, the TiO$_2$ film 8 is etched, etching neither the DD wiring (W wiring) 7 nor the TiN film 6, as is illustrated in FIG. 1G. If the TiN film 6 is oxidized at 500° C. or more to form the TiO$_2$ film 8, however, the TiO$_2$ film 8 is crystallized. In this case, the TiO$_2$ film 8 cannot be completely etched away, and residue inevitably remains on the DD wiring 7. Thus, it is desirable to oxidize the TiN film 6 at a low temperature of 400° C. or less.

Figure 1H:
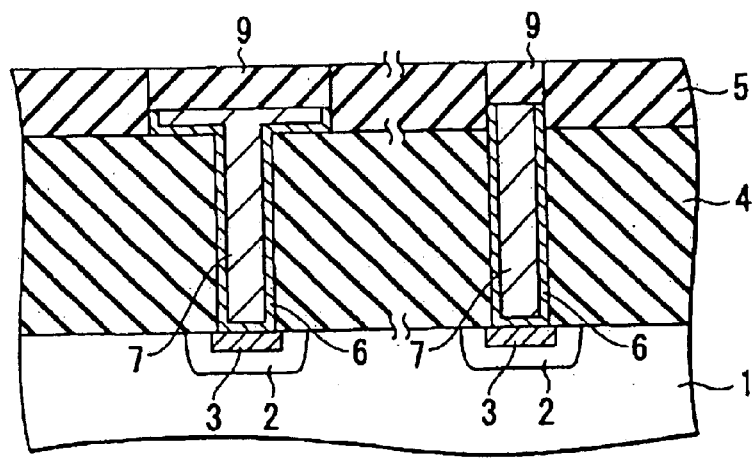

TiO$_2$ film 8 is removed in such a way that the surface of DD wiring 7 becomes almost flush with the surface of TiN film 6. As shown in FIG. 1H, gaps are not formed which are so large as to prevent silicon nitride film 9 from incompletely filling the wiring groove and contact hole.

(Second Embodiment)

Figure 3A:
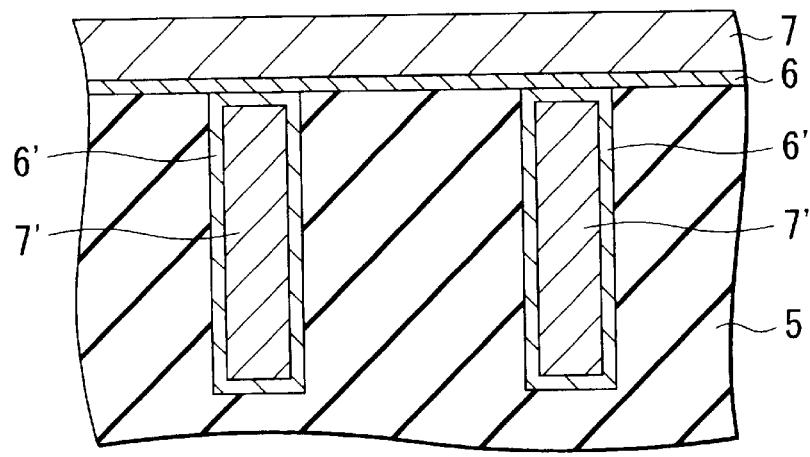
FIGS. 3A to 3C are sectional views explaining a method of manufacturing a semiconductor device according to the second embodiment of the invention.
Figure 3B:
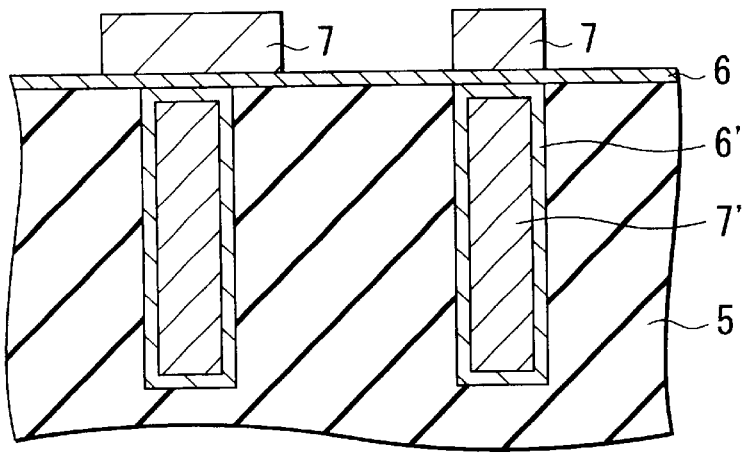
Figure 3C:
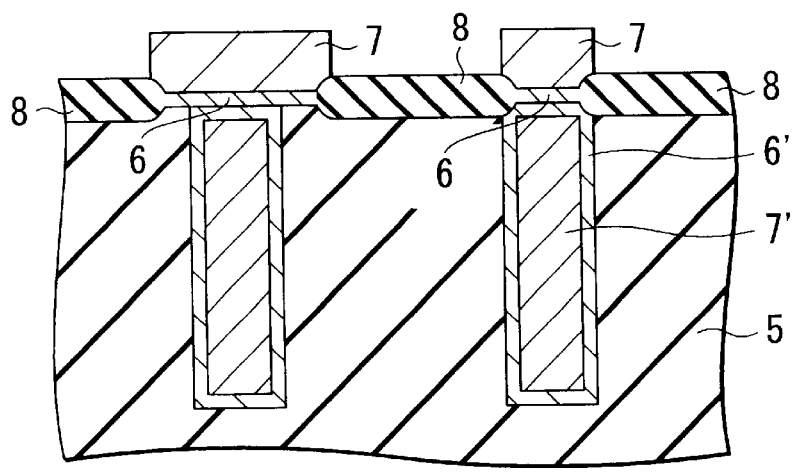

FIGS. 3A to 3C are sectional views showing the steps of manufacturing a semiconductor device according to the second embodiment of the invention. This device has RIE wirings formed by performing RIE on a conductive film. In this regard it should be recalled that the first embodiment has DD wirings.

Shown in the left half of each of FIGS. 3A to 3C is a region that has a contact hole and a RIE wiring having a width greater than the diameter of the contact hole. Shown in the right half of each figure is another region that has a contact hole and a RIE wiring having a width equal to the diameter of the contact hole. The components equivalent to those shown in FIGS. 1A to 1H are designated at the same reference numerals in FIGS. 3A to 3C and will not be described in detail.

First, as shown in FIG. 3A, a TiN film 6, i.e., a barrier metal film, is formed on the second inter-layer insulating film 5. Thereafter, a W film 7 is formed on the TiN film 6. As shown in FIG. 3A, the inter-layer insulating film 5 has trenches. In each trench, a plug 7' made of W is formed. The plug 7' is covered, at all its sides, with a TiN film 6' that is a barrier metal film.

Next, as shown in FIG. 3B, photolithography and RIE are performed on the W film 7, forming W wirings 7.

As shown in FIG. 3C, the TiN film 6 is oxidized by using the W wirings 7 as a mask. Those parts of the TiN film 6 which not covered with the W wirings 7 are thereby changed to $TiO_2$ films 8. The TiN film 6 is oxidized in the same condition as in the first embodiment. A part of each $TiO_2$ films 8 thus formed lies beneath the edge of one RIE wiring 7. Nevertheless, this part is not so large as to increase the resistance of the RIE wiring 7.

Since the TiN film 6 is oxidized, it is unnecessary to remove, by etching, that part of the TiN film 6 which is not covered with the RIE wiring 7. Over-etching that may affect the second inter-layer insulating film 5 can be therefore prevented. Further, the $TiO_2$ films 8 may be removed by means of etching, if they are unnecessary.

The present invention is not limited to the embodiments described above. For example, the wirings may be made of, for example, Cu, Ag, Au, Ru or Mo, not tungsten (W) that is used in the embodiments described above. Alternatively, the wirings may be made of alloy of two or more metals selected from the group consisting of W, Cu, Ag, Au, Ru and Mo.

The barrier metal film may be made of material other than TiN. They may be made of, for example, metal nitride such as tantalum nitride, niobium nitride, zirconium nitride or hafnium nitride. Alternatively, they may be made of metal carbide, metal boride, metal-Si nitride or metal-carbon nitride.

Furthermore, the substrate may be other the silicon substrate used in the above embodiments. For example, the substrate may be an SOI substrate to minimize the parasitic capacitance, thereby to provide a high-speed device. Alternatively, the substrate may be a semiconductor substrate that has an active region made of SiGe.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate having a conductive region;
    a first insulating film provided on the semiconductor substrate and having a wiring groove in a surface;
    a conductive film provided on a bottom of the wiring groove and lower sides of the wiring groove;
    a second insulating film provided on upper sides of the wiring groove, formed by oxidizing a film of the same material as the conductive film and connected to the conductive film;
    a wiring provided in the conductive film and located in the wiring groove, having an upper surface at a level lower than an upper surface of the first insulating film; and
    a third insulating film provided on the wiring and buried in the wiring groove in contact with the conductive film.

2. The semiconductor device according to claim 1, wherein the reduction of the Gibbs free energy when the wiring is oxidized is smaller than the reduction of the Gibbs free energy when the conductive film is oxidized.

3. The semiconductor device according to claim 1, wherein an interface between the conductive film and the second insulating film is at a level not higher than the upper surface of the wiring.

4. The semiconductor device according to claim 1, wherein the first insulating film has a plug made of the same material as the wiring, and the bottom of the wiring groove and the conductive region are connected by the plug.

5. The semiconductor device according to claim 1, wherein the conductive film is a barrier metal film, and the wiring is a metal wiring.

6. The semiconductor device according to claim 1, wherein the barrier metal film is made of metal nitride.

7. The semiconductor device according to claim 1, wherein the metal wiring is made of at least one material selected from the group consisting of tungsten, molybdenum, ruthenium, copper, and silver.

8. The semiconductor device according to claim 1, wherein the semiconductor substrate comprises an insulating region and a conductive region provided on the insulating region.

9. The semiconductor device according to claim 4, wherein the wiring has a width greater than a diameter of the plug.

10. The semiconductor device according to claim 4, wherein the wiring has a width equal to a diameter of the plug.

11. The semiconductor device according to claim 1, wherein the wiring has a width at least as wide as a diameter of the plug.

12. The semiconductor device according to claim 1, wherein the conductive film is made of metal nitride, and the wiring is made of at least one material selected from the group consisting of tungsten, molybdenum, ruthenium, copper, and silver.

13. The semiconductor device according to claim 1, wherein the conductive film includes metal and nitrogen.

14. The semiconductor device according to claim 1, wherein the conductive film consists of nitride.

15. The semiconductor device according to claim 1, wherein the conductive film is metal-silicon alloy.

16. A semiconductor device comprising:
    a semiconductor substrate having a conductive region;
    a first insulating film provided on the semiconductor substrate and having a wiring groove in a surface;

a conductive film provided on a bottom of the wiring groove and lower sides of the wiring groove;

a second insulating film provided on upper sides of the wiring groove;

a wiring provided in the conductive film and located in the wiring groove, having an upper surface at a level lower than an upper surface of the first insulating film; and a third insulating film, composed of a material different from the second insulating film, and which is provided on the wiring and buried in the wiring groove in contact with the conductive film.

17. The semiconductor device according to claim 16, wherein said second insulating film comprises an oxide of the same material as the conductive film and connected to the conductive film.

18. The semiconductor device according to claim 17, wherein reduction of Gibbs free energy when the wiring is an oxide is smaller than that of the conductive film when the wiring and conductive film are oxidized.

19. The semiconductor device according to claim 17, wherein an interface between the conductive film and the second insulating film is at a level not higher than the upper surface of the wiring.

20. The semiconductor device according to claim 17, wherein the first insulating film has a plug made of the same material as the wiring, and the bottom of the wiring groove and the conductive region are connected by the plug.

21. The semiconductor device according to claim 20, wherein the wiring has a width greater than a diameter of the plug.

22. The semiconductor device according to claim 20, wherein the wiring has a width equal to a diameter of the plug.

23. The semiconductor device according to claim 17, wherein the conductive film is a barrier metal film, and the wiring is a metal wiring.

24. The semiconductor device according to claim 17, wherein the barrier metal film is made of metal nitride.

25. The semiconductor device according to claim 17, wherein the metal wiring is made of at least one material selected from the group consisting of tungsten, molybdenum, ruthenium, copper and silver.

26. The semiconductor device according to claim 17, wherein the semiconductor substrate comprises an insulating region and a conductive region provided on the insulating region.

27. The semiconductor device according to claim 16, wherein the wiring has a width at least as wide as a diameter of the plug.

28. The semiconductor device according to claim 16, wherein the conductive film is made of metal nitride, and the wiring is made of at least one material selected from the group consisting of tungsten, molybdenum, ruthenium, copper and silver.

29. The semiconductor device according to claim 16, wherein the conductive film includes metal and nitrogen.

30. The semiconductor device according to claim 16, wherein the conductive film consists of nitride.

31. The semiconductor device according to claim 16, wherein the conductive film is metal-silicon alloy.

* * * * *